United States Patent [19]

Spencer

[11] Patent Number: 5,136,262
[45] Date of Patent: Aug. 4, 1992

[54] OSCILLATOR CIRCUIT AND METHOD FOR MEASURING CAPACITANCE AND SMALL CHANGES IN CAPACITANCE

[75] Inventor: Mark E. Spencer, Mesa, Ariz.
[73] Assignee: Sentech Corporation, Tempe, Ariz.
[21] Appl. No.: 808,176
[22] Filed: Dec. 13, 1991
[51] Int. Cl.⁵ .............................................. H03B 5/00
[52] U.S. Cl. ...................................... 331/135; 331/65; 324/681
[58] Field of Search .................. 331/65, 135; 324/609, 324/658, 661, 662, 674, 676, 679, 681, 686

[56] References Cited

U.S. PATENT DOCUMENTS

| | | | |
|---|---|---|---|
| 4,295,091 | 10/1991 | Ponkala | 324/681 |
| 4,347,740 | 11/1982 | Townsend | 331/65 |
| 4,399,403 | 8/1983 | Strandberg, Jr. et al. | 324/640 |
| 4,719,409 | 1/1988 | Dorman | 324/681 |
| 4,737,706 | 4/1988 | Eilersen | 324/681 |
| 4,775,830 | 10/1988 | Lyyra | 324/674 |

*Primary Examiner*—Robert J. Pascal
*Attorney, Agent, or Firm*—Harry M. Weiss

[57] ABSTRACT

An improved oscillator circuit and method for measuring capacitance and small changes in capacitance is described. The circuit provides a digital output signal that has a frequency inversely proportional to the capacitance being measured, is substantially immune to stray capacitance, has low sensitivity to noise and temperature variations, is relatively simple and inexpensive to implement and provides a high precision measurement. One embodiment of the oscillator includes a capacitor to be measured, an integrator, a comparator, a resistive attenuator, a summing amplifier and a digital output circuit. A second embodiment of the oscillator further provides compensation for the non-linear response of a parallel plate capacitive transducer.

38 Claims, 2 Drawing Sheets

OSCILLATOR CIRCUIT AND METHOD FOR MEASURING CAPACITANCE AND SMALL CHANGES IN CAPACITANCE

RELATED APPLICATION

This application is related to the patent application entitled "IMPROVED CAPACITANCE SENSOR CIRCUIT AND METHOD FOR MEASURING CAPACITANCE AND SMALL CHANGES IN CAPACITANCE", which is filed concurrently herewith, same inventor.

BACKGROUND OF THE INVENTION

1. Field of the Invention

This invention relates to oscillator circuits and methods for measuring capacitance and small changes in capacitance and more specifically relates to an improved oscillator circuit and method for measuring capacitance and small changes in capacitance which eliminates the influence of stray capacitances and linearizes the responses of parallel plate capacitive transducers which are used to sense distance, force, pressure, vibration and other physical parameters.

2. Description of the Prior Art

Capacitive transducers are commonly employed in electronic systems for measuring distance, force and other physical parameters. Many of these transducers take the form of a parallel plate capacitor, in which the capacitance is ideally inversely proportional to the separation of the plates. Measurement of this capacitance indicates the distance between the plates, which may also be related to a force, pressure, temperature or other physical parameter which modulates the plate separation.

The accuracy of circuits and methods for measuring capacitance and small changes in capacitance have typically been limited by the influence of stray capacitances which are unavoidable in any practical embodiment. This problem is particularly acute when measuring capacitances or changes in capacitance that are one picofarad (pF) or less. In these cases, the stray capacitance of the circuit components and the wires connecting the circuit to the transducer may exceed the capacitance that is to be measured. The accuracy of circuits and methods for measuring a parallel plate capacitor have been further limited by the classical fringing effect, in which electric field lines near the edges of the plates deviate from the straight line paths they follow in the ideal case, resulting in a capacitance which is a non-linear function of the inverse of distance. In many applications it is also desirable to provide a digital output signal that is suitable for further processing by digital circuits to provide a display or other indication of the value of the physical parameter that is related to the capacitance being measured.

U.S. Pat. No. 4,347,740 (Townsend) discloses an oscillator circuit for measuring capacitance which is prone to errors induced by stray capacitance and does not provide a means for linearizing the response of a parallel plate capacitive transducer.

U.S. Pat. No. 4,719,409 (Dorman) discloses a system for measuring physical parameters using a capacitive transducer and an oscillator circuit. This system may provide some improvement in the stray capacitance problem, at the cost of added circuit complexity, but does not provide a means for linearizing the response of a parallel plate capacitive transducer.

U.S. Pat. No. 4,737,706 (Eilersen) and U.S. Pat. No. 4,295,091 (Ponkala) both disclose oscillator circuits for measuring capacitance, however, they both do not provide a means for linearizing the non-linear response of a practical parallel plate capacitive transducer.

Therefore, there existed a need to provide an improved oscillator circuit and method for measuring capacitance and small changes in capacitance that provides high performance, is relatively simple, inexpensive to build, immune to stray capacitance, has means for linearizing the non-linear response of a parallel plate capacitive transducer and provides a digital output signal that is suitable for further processing by digital circuits.

SUMMARY OF THE INVENTION

It is an object of this invention to provide an improved oscillator circuit and method for measuring capacitance and small changes in capacitance.

It is another object of this invention to provide an improved oscillator circuit and method for measuring capacitance and small changes in capacitance that is not affected by stray capacitance.

It is a further object of this invention to provide an improved oscillator circuit and method for measuring capacitance and small changes in capacitance that is relatively simple and inexpensive to build.

It is a further object of this invention to provide an improved oscillator circuit and method for measuring capacitance and small changes in capacitance that linearizes the non-linear response of a parallel plate capacitive transducer.

It is yet another object of this invention to provide an improved oscillator circuit and method for measuring capacitance and small changes in capacitance that provides a digital output signal suitable for further processing by digital circuits.

According to the present invention, an improved oscillator circuit for measuring capacitance and small changes in capacitance is provided. This circuit provides an output signal that has a frequency inversely proportional to the sensed or measured capacitance and is implemented using relatively inexpensive components that are readily available. This circuit is substantially immune to the effects of stray capacitance associated with the cables connecting the circuit to the capacitance that is to be sensed or measured, or stray capacitance between either plate of the capacitor that is to be sensed or measured and ground. A portion of the circuit provides the function of linearizing the non-linear response of a parallel plate capacitive transducer.

The foregoing and other objects, features and advantages will be apparent from the following description of the preferred embodiments of the invention as illustrated in the accompanying drawings.

DESCRIPTION OF THE PREFERRED EMBODIMENTS

Figure 1:
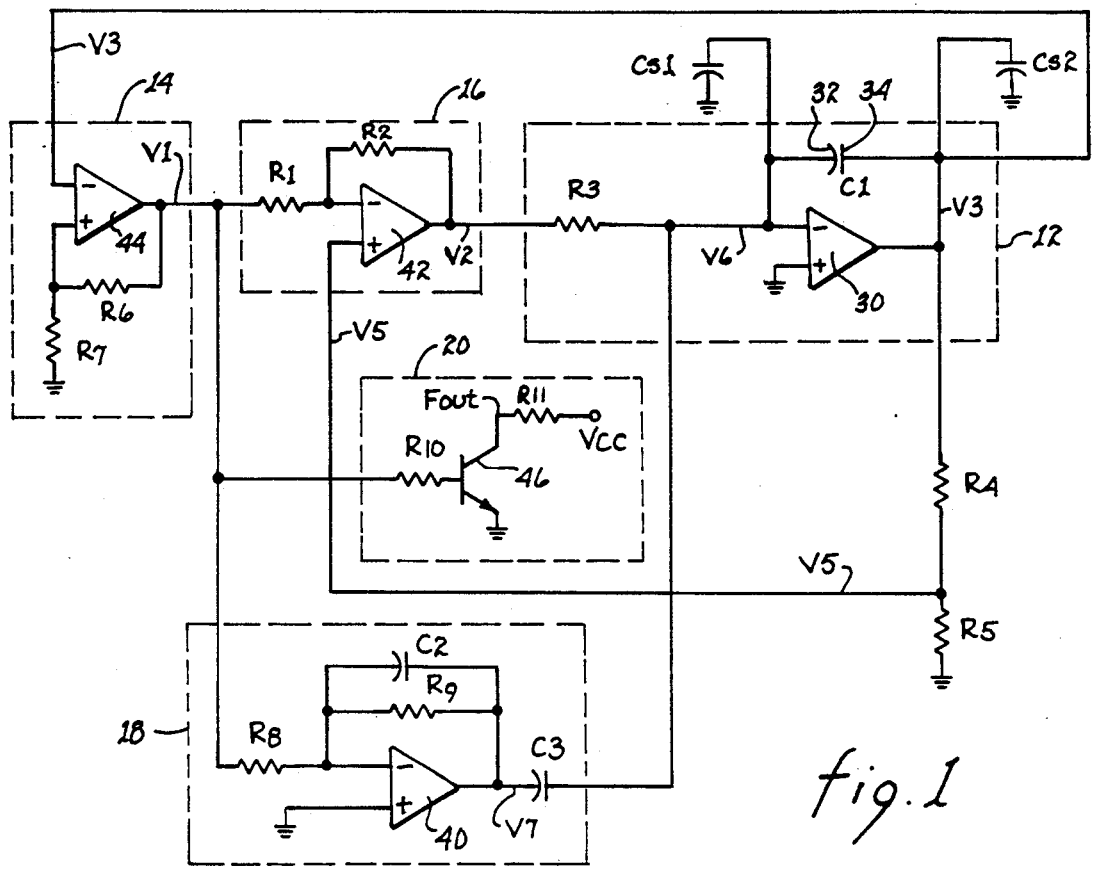
FIG. 1 is an electrical schematic of the oscillator circuit of the present invention.
Figure 2:
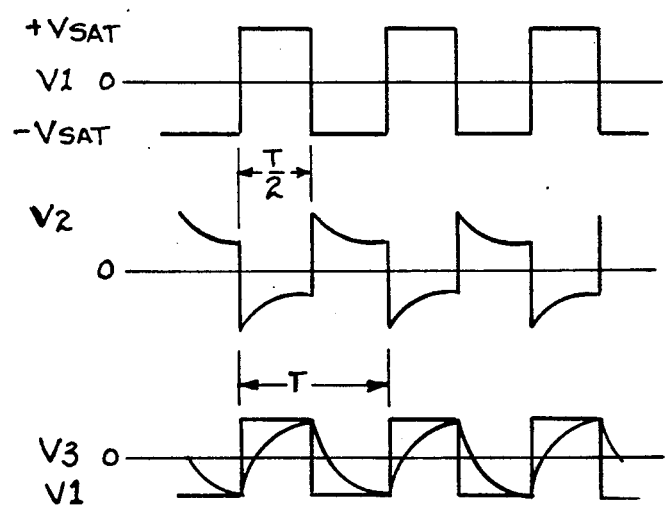
FIG. 2 shows the waveforms that correspond to the response of the circuit in FIG. 1 without including the linearization function.

FIG. 1 shows the oscillator circuit according to the present invention. According to the first embodiment of the present invention, the circuit of FIG. 1 does not include the linearization function. This embodiment is used for measuring the values of fixed capacitors or capacitive transducers which do not exhibit the non-linearity that is typical of parallel plate capacitive transducers. The circuit of the first embodiment (FIG. 1) therefore comprises an inverting integrator 12 that includes the capacitance to be measured, C1, resistor R3 and operational amplifier 30; a summing amplifier 16 that includes resistor R1, resistor R2 and operational amplifier 42; a bistable circuit 14 that includes voltage comparator 44 and, if desired, resistor R6 and resistor R7; a voltage divider that includes resistor R4 and resistor R5; and a digital output circuit 20 that includes resistor R10, resistor R11, transistor 46 and digital supply voltage VCC. Optional resistors R6 and R7 would be included to set upper and lower comparator thresholds that have smaller magnitudes than the upper and lower comparator output voltages. Assuming the operational amplifiers to be ideal, meaning that no currents flow into their inputs, their open-loop gains are infinite and their output impedance is negligible, the operation of the circuit is described as follows, with reference to the voltage waveforms of FIG. 2:

Assume that the output V1 of comparator 14 has just transitioned from its negative state, −Vsat, to its positive state, +Vsat. This means that the voltage V3 at the inverting comparator input has dropped below the voltage V4 at the non-inverting comparator input. When V1 switches to its positive state, V2 becomes negative, due to the inverting action of summing amplifier 16 with gain-setting resistors R1 and R2. From this negative peak, V2 begins rising exponentially, due to the contribution of V5 to the non-inverting input of summing amplifier 16. Since V2 is negative and the integrator 12 is inverting, the output V3 of the integrator 12 begins increasing. Furthermore, since V2 has an exponential characteristic, the output V3 of the integrator 12 also has an exponential characteristic. Resistors R4 and R5 form a voltage divider that attenuates V3 to generate V5. Voltages V3 and V5 increase exponentially from negative values to positive values until V3 slightly exceeds V4 and the comparator 14 switches to its negative state, −Vsat. This completes one half cycle of oscillation. The operation of the circuit for the second half cycle of oscillation follows the description for the first half cycle, except that all voltage polarities are reversed, all increasing exponentials become decreasing exponentials and all decreasing exponentials become increasing exponentials. The output of comparator 14 is also provided to digital output circuit 20 for switching transistor 46 on and off at the same frequency as the output of comparator 14, thereby providing an open-collector digital output that can be counted, demodulated or otherwise further processed by external digital circuits.

Assuming the magnitudes of +Vsat and −Vsat are equal, the period of oscillation of this circuit is given by:

$$T = 2\tau \ln \left[ \frac{\left(\frac{R2}{R1+R2}\right)\left(1+\frac{R4}{R5}\right)+\left(\frac{R7}{R6+R7}\right)}{\left(\frac{R2}{R1+R2}\right)\left(1+\frac{R4}{R5}\right)-\left(\frac{R7}{R6+R7}\right)} \right] \quad (1)$$

where:

$$\tau = \frac{R1 R3 (R4+R5) C1}{(R1+R2) R5} \quad (2)$$

The period of oscillation is thus directly proportional to C1. Since frequency is the inverse of the period (f=1/T), the frequency of oscillation is inversely proportional to C1. If C1 represents an ideal parallel plate capacitor, the frequency of oscillation is directly proportional to the distance between the parallel plates. If optional resistor R6 is replaced by a short circuit and optional resistor R7 is omitted, equation (1) simplifies to:

$$T = 2\tau \ln \left[ \frac{\left(\frac{R2}{R1+R2}\right)\left(1+\frac{R4}{R5}\right)+1}{\left(\frac{R2}{R1+R2}\right)\left(1+\frac{R4}{R5}\right)-1} \right] \quad (3)$$

In the preferred embodiments of the invention, resistors R1, R2, R4, R6 and R7 have substantially the same value, resistor R3 has a much larger value than the others and resistor R5 has a much smaller value than the others. The argument of the natural logarithm is therefore dominated by the first term in the numerator and the first term in the denominator, which are identical. The value of the natural logarithm is thus substantially immune to changes in the values of R1, R2, R4 and R5 which may be caused, for example, by changes in the ambient temperature. The temperature stability of the period of oscillation is therefore determined primarily by the temperature stability of the resistor ratios in equation (2). To achieve temperature stability of the period of oscillation, these resistors must track each other over a range of ambient temperatures, but temperature stability of the actual resistance values is not required. This is important from a practical standpoint, since resistor networks that have closely matched temperature coefficients are relatively inexpensive and readily available, while resistors and resistor networks that have very small temperature coefficients are rather costly.

The circuit of the present invention achieves substantial immunity from stray capacitance by its configuration of integrator 12, in which the non-inverting input of operational amplifier 30 is at circuit ground potential. Due to the high open-loop gain of operational amplifier 30, the differential voltage between its inverting and non-inverting inputs is essentially zero. The voltage V6 at the inverting input of operational amplifier 30 therefore remains fixed at circuit ground potential. A constant voltage is maintained across stray capacitance Cs1, so it is neither charged nor discharged and thus has no influence on the period of oscillation. The integrator (operational amplifier 30) output signal V3 appears across stray capacitance Cs2, which is charged and discharged by operational amplifier 30. To the extent that operational amplifier 30 is capable of sourcing and sinking sufficient current to charge and discharge Cs2, in addition to the current it must carry to charge and discharge C1 and the current it must provide to the voltage divider consisting of R4 and R5, Cs2 has no influence on the period of oscillation. Cs1 and Cs2 may result, for example, from cabling connecting C1 to the oscillator circuit. The substantial immunity of the frequency of oscillation from Cs1 and Cs2 therefore allows capacitor C1 to be remotely located from the oscillator circuit without inducing errors in the measurement of C1.

In the situation where the operational amplifiers are not ideal, temperature-induced changes in operational amplifier delays will affect the frequency, but this error can be minimized by choosing operational amplifiers with sufficiently high gain-bandwidth products that delays are negligible, or by choosing operational amplifiers with lower temperature-stable gain-bandwidth products. Operational amplifier input bias currents do not contribute to error, but merely change the duty cycle of the comparator (14) output, V1. Variations in operational amplifier input offset voltage are a minor source of error, as the circuit can tolerate several millivolts of input offset voltage before the operating frequency changes significantly.

The circuit of the present invention also exhibits low sensitivity to noise. The integrator 12 inherently provides time-averaging of the current flowing through C1 so that internally generated or externally induced noise is averaged out. This noise immunity is particularly advantageous in industrial environments. In addition, the simplicity and low parts count of the circuit allows for low cost and high reliability.

Some of the prior art oscillator circuits for measuring capacitance, including that of U.S. Pat. No. 4,295,091 (Ponkala) incorporate the capacitance that is to be measured into an integrator circuit. In Ponkala's circuit, the capacitance that is to be measured is charged and discharged with a constant current, resulting in a triangular voltage waveform at the output of the integrator. The unique configuration of the present invention, which charges and discharges capacitor C1 with an exponential current and results in an exponential voltage waveform at the output of integrator 12, has certain advantages when the linearization function is utilized, as in the second embodiment of the present invention.

The second embodiment of the present invention adds the linearization function 18 to the previously described basic circuit to linearize the response of a practical parallel plate capacitive transducer. The transducer consists of a sensing plate 32 connected to the inverting input of operational amplifier 30 and a second plate 34, driven by the integrator (operational amplifier 30) output V3. The two plates 32 and 34 form the capacitance C1, which modulates the frequency of oscillation to provide a measurement of some physical quantity that is related to the separation between plates 32 and 34. In proximity detection applications, plate 34 is a conductive object whose distance from the sensing plate 32 is directly proportional to the frequency of oscillation. In vibration measurement applications, plate 34 may be a conductive element in a piece of rotating machinery, for example, whose displacements about a nominal position relative to sensing plate 32 will modulate the capacitance between the plates, thus frequency modulating the oscillator and providing a frequency modulated (FM) output signal which can be demodulated to measure the amplitudes and frequencies of vibration. Other physical quantities such as pressure, force and temperature may be measured by parallel plate capacitive transducers in which the separation between the plates varies as a function of the applied pressure, force or temperature.

Figure 3:
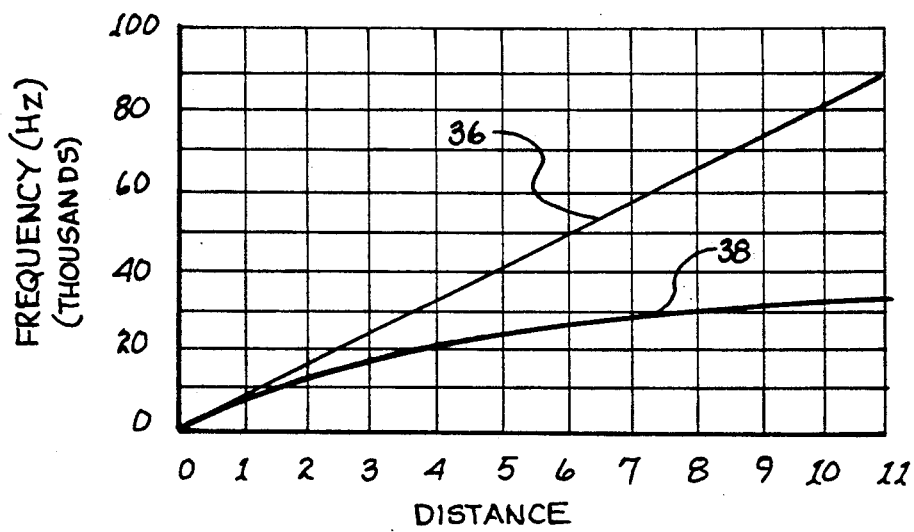
FIG. 3 is a diagram showing the difference in response between an ideal and a practical parallel plate capacitive transducer.

In all of these applications, the capacitance is not inversely proportional to the distance between the plates, due to fringing of the electric field lines near the edges of the plates and also due to the presence of nearby conductive objects. A typical frequency vs. distance plot for a capacitance proximeter utilizing the oscillator circuit of the present invention is shown in FIG. 3. Since the oscillator frequency is inversely proportional to the capacitance, a perfectly linear frequency vs. distance response as indicated by 36 in FIG. 3 would be expected. The non-linearity due to fringing and the presence of nearby conductors, indicated by 38 in FIG. 3, becomes more pronounced as the separation between the plates increases. This effect can be modeled as a stray capacitance in parallel with an ideal parallel plate capacitor.

Figure 4:
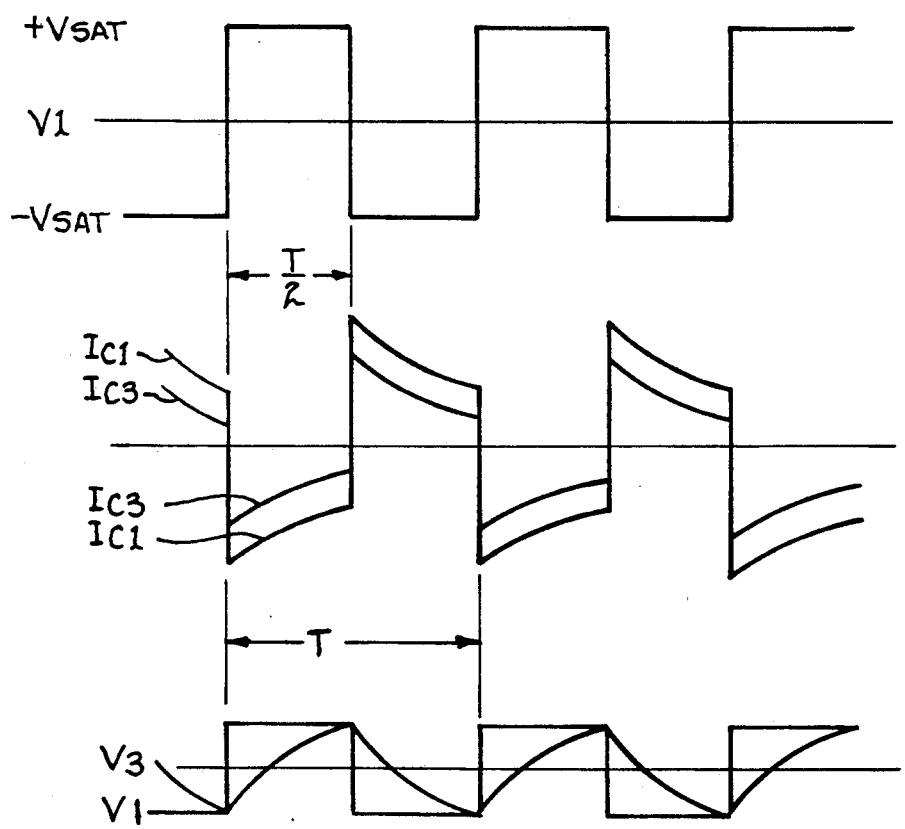
FIG. 4 shows the waveforms that correspond to the response of the circuit in FIG. 1 including the linearization function.

The linearization function 18 scales and inverts the output signal V1 from comparator 14 to generate V7, which is coupled to the sensing plate 32 through capacitor C3. The waveforms of the circuit with the linearization function 18 in place are shown in FIG. 4. The transient current, IC3, that is added to or subtracted from the sensing plate 32 through capacitor C3 has an exponential response which complements the basic current, IC1, that normally flows through capacitor C1. The exponential characteristics of the IC1 current waveform and all other voltage and current waveforms in the circuit are therefore not altered by the addition of the linearization function. The IC3 current added and subtracted to sensing plate 32 has the effect of making capacitor C1 appear smaller than its actual value, thereby providing a means for removing the effective stray capacitance caused by fringing and nearby conductors. At higher frequencies of oscillation corresponding to smaller values of C1, the IC3 current comprises a larger percentage of the IC1 current than at lower frequencies. The linearization function 18 therefore automatically provides greater correction for large plate separations, where the non-linearity is greatest, than for small plate separations, where the non-linearity is minimal. The performance of the linearization function 18 can be further enhanced by adding capacitor C2 in parallel with resistor R7, to induce a lowpass frequency response in the linearization function 18. The correct values for capacitor C2, capacitor C3 and the linearization function gain-setting resistors R8 and R9 must be empirically determined for a given capacitive transducer in a given installation. Either resistor R8 or resistor R9 may be a potentiometer configured as a variable resistor and mounted to allow external adjustment of the linearization function gain.

A common capacitive proximeter employs a circular sensing plate, with the second plate of the capacitor being formed by a conductive object whose distance from the sensing plate is to be measured. Prior art oscillator circuits used in this application typically have a useable range of approximately 1/10 of the sensing plate diameter. As the distance to the conductive object increases beyond this, the error introduced by the transducer non-linearity become excessive for most applications. The circuit of the present invention has achieved excellent linearity out to distances exceeding twice the sensing plate diameter with a variety of different transducers with different plate diameters. This is a significant advance over the known prior art.

While the invention has been described in its preferred embodiments, it is to be understood that the words which have been used are words of description rather than limitation, and that changes may be made in the preferred embodiments of the invention described without departing from the true scope and spirit of the invention. It is intended by the appended claims to cover any and all such modifications.

I claim:

1. An oscillator circuit for measuring capacitance and small changes in capacitance comprising, in combination:
   a capacitor having a capacitance to be measured;
   means for generating an output signal that is proportional to the integral over time of an exponential current flowing through said capacitor;
   means coupled to said generating means for attenuating said output signal;
   means coupled to said generating means for switching a bistable signal at a frequency that is inversely proportional to said capacitance to thereby provide an indication of the value of said capacitance; and
   means coupled to said switching means, coupled to said attenuating means and coupled to said generating means for summing an output of said switching means and an output of said attenuating means.

2. The oscillator circuit of claim 1 wherein said generating means comprises an amplifier having an input coupled to a first terminal of said capacitor and having an output coupled to a second terminal of said capacitor.

3. The oscillator circuit of claim 1 wherein said generating means comprises:
   a resistor having a first terminal coupled to the input of said generating means and having a second terminal coupled to a first terminal of said capacitor; and
   an operational amplifier having an inverting input coupled to said first terminal of said capacitor, having a non-inverting input coupled to circuit ground and having an output coupled to a second terminal of said capacitor and coupled to the output of said generating means.

4. The oscillator circuit of claim 1 wherein said attenuating means comprises a resistive voltage divider having an input coupled to said output of said generating means and having an output coupled to said summing means.

5. The oscillator circuit of claim 1 wherein said switching means comprises a bistable circuit having a first input coupled to said output of said generating means, having a second input and having an output coupled to an input of said summing means and coupled to a feedback network to feed back a portion of said output of said bistable circuit to said second input of said bistable circuit.

6. The oscillator circuit of claim 5 wherein said feedback network comprises a resistive voltage divider having an input coupled to said output of said bistable circuit and having an output coupled to said second input of said bistable circuit.

7. The oscillator circuit of claim 5 wherein said bistable circuit comprises a voltage comparator having an inverting input coupled to said output of said generating means, having a non-inverting input and having an output coupled to an input of said summing means and coupled to a feedback network to feed back a portion of said output of said voltage comparator to said non-inverting input of said voltage comparator.

8. The oscillator circuit of claim 7 wherein said feedback network comprises a resistive voltage divider having an input coupled to said output of said voltage comparator and having an output coupled to said non-inverting input of said voltage comparator.

9. The oscillator circuit of claim 1 wherein said summing means comprises a summing amplifier having a first input coupled to said output of said switching means, having a second input coupled to an output of said attenuating means and having an output coupled to an input of said generating means.

10. The oscillator circuit of claim 9 wherein said summing amplifier comprises:
    a first resistor having a first terminal coupled to the first input of said summing amplifier and having a second terminal;
    a second resistor having a first terminal coupled to said second terminal of said first resistor and having a second terminal; and
    an operational amplifier having an inverting input coupled to said second terminal of said first resistor, having a non-inverting input coupled to the second input of said summing amplifier and having an output coupled to the output of said summing amplifier.

11. The oscillator circuit of claim 1 wherein said capacitor to be measured comprises a parallel plate capacitive transducer for measuring a physical parameter that is a function of a separation of the parallel plates.

12. The oscillator circuit of claim 1 wherein said capacitor to be measured comprises a capacitive proximeter for measuring distance or vibration having an electrically conductive sensing plate and having an electrical connection to a conductive object whose distance from said sensing plate or whose vibration is to be measured, with said capacitance of said capacitor to be measured being the capacitance between said sensing plate and said conductive object.

13. The oscillator circuit of claim 12 further comprising compensation means for linearizing the normally non-linear frequency vs. distance response obtained when the distance from said sensing plate to said conductive object is large relative to the physical size of said sensing plate.

14. The oscillator circuit of claim 13 wherein said compensation means comprises:
    an amplifier having an input coupled to said output of said switching means; and
    a second capacitor having a first terminal coupled to said output of said amplifier and having a second terminal coupled to said sensing plate.

15. The oscillator circuit of claim 14 wherein said amplifier comprises:
    a first resistor having a first terminal coupled to said output of said switching means and having a second terminal;
    a second resistor having a first terminal electrically coupled to said second terminal of said first resistor and having a second terminal; and
    an operational amplifier having an inverting input coupled to said second terminal of said first resistor, having a non-inverting input coupled to circuit ground and having an output.

16. The oscillator circuit of claim 15 wherein one of said first or said second resistor comprises a potentiometer configured as a variable resistor to allow external adjustment of said compensation means.

17. The oscillator circuit of claim 14 further comprising a third capacitor coupled to said amplifier to induce a lowpass frequency response in said amplifier.

18. The oscillator circuit of claim 1 further comprising means coupled to said switching means for converting an output of said switching means to a digital output signal having a frequency inversely proportional to said capacitance and suitable for processing by external digital circuits to thereby indicate the value of said capacitance.

19. The oscillator circuit of claim 18 wherein said converting means comprises a transistor switch having an open-collector output coupled to a digital supply voltage through a resistor.

20. A method for measuring capacitance and small changes in capacitance comprising, in combination:
   providing a capacitor having a capacitance to be measured;
   providing means for generating an output signal that is proportional to the integral over time of an exponential current flowing through said capacitor;
   providing means coupled to said generating means for attenuating said output signal;
   providing means coupled to said generating means for switching a bistable signal at a frequency that is inversely proportional to said capacitance to thereby provide an indication of the value of said capacitance; and
   providing means coupled to said switching means, coupled to said attenuating means and coupled to said generating means for summing an output of said switching means and an output of said attenuating means.

21. The method of claim 20 wherein said generating means comprises an amplifier having an input coupled to a first terminal of said capacitor and having an output coupled to a second terminal of said capacitor.

22. The method of claim 20 wherein said generating means comprises:
   a resistor having a first terminal coupled to the input of said generating means and having a second terminal coupled to a first terminal of said capacitor; and
   an operational amplifier having an inverting input coupled to said first terminal of said capacitor, having a non-inverting input coupled to circuit ground and having an output coupled to a second terminal of said capacitor and coupled to the output of said generating means.

23. The method of claim 20 wherein said attenuating means comprises a resistive voltage divider having an input coupled to said output of said generating means and having an output coupled to said summing means.

24. The method of claim 20 wherein said switching means comprises a bistable circuit having a first input coupled to said output of said generating means, having a second input and having an output coupled to an input of said summing means and coupled to a feedback network to feed back a portion of said output of said bistable circuit to said second input of said bistable circuit.

25. The method of claim 24 wherein said feedback network comprises a resistive voltage divider having an input coupled to said output of said bistable circuit and having an output coupled to said second input of said bistable circuit.

26. The method of claim 24 wherein said bistable circuit comprises a voltage comparator having an inverting input coupled to said output of said generating means, having a non-inverting input and having an output coupled to an input of said summing means and coupled to a feedback network to feed back a portion of said output of said voltage comparator to said non-inverting input of said voltage comparator.

27. The method of claim 26 wherein said feedback network comprises a resistive voltage divider having an input coupled to said output of said voltage comparator and having an output coupled to said non-inverting input of said voltage comparator.

28. The method of claim 20 wherein said summing means comprises a summing amplifier having a first input coupled to said output of said switching means, having a second input coupled to an output of said attenuating means and having an output coupled to an input of said generating means.

29. The method of claim 28 wherein said summing amplifier comprises:
   a first resistor having a first terminal coupled to the first input of said summing amplifier and having a second terminal;
   a second resistor having a first terminal coupled to said second terminal of said first resistor and having a second terminal; and
   an operational amplifier having an inverting input coupled to said second terminal of said first resistor, having a non-inverting input coupled to the second input of said summing amplifier and having an output coupled to the output of said summing amplifier.

30. The method of claim 20 wherein said capacitor to be measured comprises a parallel plate capacitive transducer for measuring a physical parameter that is a function of a separation of the parallel plates.

31. The method of claim 20 wherein said capacitor to be measured comprises a capacitive proximeter for measuring distance or vibration having an electrically conductive sensing plate and having an electrical connection to a conductive object whose distance from said sensing plate or whose vibration is to be measured, with said capacitance of said capacitor to be measured being the capacitance between said sensing plate and said conductive object.

32. The method of claim 31 further including the step of providing compensation means for linearizing the normally non-linear frequency vs. distance response obtained when the distance from said sensing plate to said conductive object is large relative to the physical size of said sensing plate.

33. The method of claim 32 wherein said compensation means comprises:
   an amplifier having an input coupled to said output of said switching means; and
   a second capacitor having a first terminal coupled to said output of said amplifier and having a second terminal coupled to said sensing plate.

34. The method of claim 33 wherein said amplifier comprises:
   a first resistor having a first terminal coupled to said output of said switching means and having a second terminal;

a second resistor having a first terminal electrically coupled to said second terminal of said first resistor and having a second terminal; and an operational amplifier having an inverting input coupled to said second terminal of said first resistor, having a non-inverting input coupled to circuit ground and having an output.

35. The method of claim 34 wherein one of said first or said second resistor comprises a potentiometer configured as a variable resistor to allow external adjustment of said compensation means.

36. The method of claim 33 further including the step of providing a third capacitor coupled to said amplifier to induce a lowpass frequency response in said amplifier.

37. The method of claim 20 further including the step of providing means coupled to said switching means for converting an output of said switching means to a digital output signal having a frequency inversely proportional to said capacitance and suitable for processing by external digital circuits to thereby indicated the value of said capacitance.

38. The method of claim 37 wherein said converting means comprises a transistor switch having an open-collector output coupled to a digital supply voltage through a resistor.

* * * * *